United States Patent
Mojaradi et al.

[11] Patent Number: 5,381,018
[45] Date of Patent: Jan. 10, 1995

[54] ELECTRONIC CIRCUIT TO REPLACE A LIGHT EMITTING DIODE AND A LIGHT DEPENDENT RESISTOR

[75] Inventors: Mohamad M. Mojaradi, Los Angeles; Tuan A. Vo, Hawthorne, both of Calif.

[73] Assignee: Xerox Corporation, Stamford, Conn.

[21] Appl. No.: 169,023

[22] Filed: Dec. 20, 1993

[51] Int. Cl.6 .................... H03K 3/42; G02B 27/00
[52] U.S. Cl. ...................................... 250/551; 327/514
[58] Field of Search ............. 250/551; 307/311, 571, 307/572; 257/290

[56] References Cited

U.S. PATENT DOCUMENTS

| | | | |
|---|---|---|---|
| 4,357,544 | 11/1982 | May et al. | 307/34 |
| 4,682,061 | 7/1987 | Donovan | 307/311 |
| 4,766,471 | 8/1988 | Ovshinsky et al. | 250/551 |

Primary Examiner—David C. Nelms
Assistant Examiner—Stephone B. Allen
Attorney, Agent, or Firm—Nola Mae McBain

[57] ABSTRACT

A variable impedance circuit in which an optoisolator transistor is controlled by an input light emitting diode to turn on a series of high voltage MOSFETs for use in applications currently using light emitting diode controlled with a light dependent resistor.

10 Claims, 4 Drawing Sheets

ELECTRONIC CIRCUIT TO REPLACE A LIGHT EMITTING DIODE AND A LIGHT DEPENDENT RESISTOR

BACKGROUND

This invention relates generally to high voltage transistor applications and more particularly concerns a circuit in which an optoisolator transistor is controlled by an input light emitting diode to turn on a series of high voltage MOSFETs for use in applications currently using a light emitting diode (LED) controlled with a high voltage light dependent resistor (LDR).

FIG. 1 shows an existing light emitting diode controlled with a light dependent resistor. A light emitting diode or LED 10 is positioned to shine light rays 12 onto a light dependent resistor or LDR 14. The LDR 14 is mounted on a substrate 16. When the LED 10 shines light rays 12 on the LDR 14, resistance of the LDR 14 changes. The resistance of the LDR 14 is linearly dependent on the intensity of the light rays 12.

Unfortunately, the response time of the LDR 14 is long and the device is sensitive to temperature change. A new circuit utilizing an optoisolator transistor controlled by an input light emitting diode to turn on a series of high voltage MOSFETs has been designed to replace the existing LDR. This new circuit has faster response times and is less sensitive to temperature changes.

Accordingly, it is the primary aim of the invention to provide a replacement circuit for an LED/LDR device which has faster response times and is less sensitive to temperature changes.

Further advantages of the invention will become apparent as tile following description proceeds.

SUMMARY OF THE INVENTION

Briefly stated and in accordance with the present invention, there is provided an optoisolator transistor controlled by an input light emitting diode to turn on a series of high voltage MOSFETs which can be used to provide a variable impedance.

While the present invention will be described in connection with a preferred embodiment and method of use, it will be understood that it is not intended to limit the invention to that embodiment/procedure. On the contrary, it is intended to cover all alternatives, modifications and equivalents as may be included within the spirit and scope of the invention as defined by the appended claims.

| Numeric List of Elements | |
|---|---|
| 10 | LED |
| 12 | light rays |
| 14 | LDR |
| 16 | substrate |
| 18 | optically controlled variable impedance circuit |
| 20 | optoisolator transistor |
| 22 | input LED |
| 24 | high voltage MOSFET |
| 26 | high voltage MOSFET |
| 28 | high voltage MOSFET |
| 32 | resistor |
| 34 | resistor |
| 36 | resistor |
| 38 | resistor |
| 40 | resistor |
| 42 | input gate |
| 44 | emitter |
| 46 | base |
| 48 | collector |
| 50 | source |
| 54 | positive node |
| 55 | positive node |
| 56 | negative node |
| 57 | negative node |
| 58 | curves |
| 60 | optically controlled variable impedance circuit |
| 62 | optoisolator transistor |
| 64 | input LED |
| 66 | high voltage MOSFET |
| 68 | resistor |
| 70 | base |
| 72 | collector |
| 74 | emitter |
| 76 | source |
| 78 | drain |
| 80 | gate |
| 82 | resistor |
| 84 | resistor |
| 86 | negative node |
| 87 | negative node |
| 88 | positive node |
| 89 | positive node |
| 90 | zener diode |
| 92 | MOSFET |
| 94 | MOSFET |
| 96 | MOSFET |

DETAILED DESCRIPTION OF THE INVENTION

Electronic applications employ optoisolators to electrically isolate one portion of a circuit from another, such as low voltage and high voltage portions. A one direction optical link is maintained between the two electrically isolated portions of the electronic application maintaining communication but preventing electrical interaction and possible damage to delicate circuitry.

Figure 2:
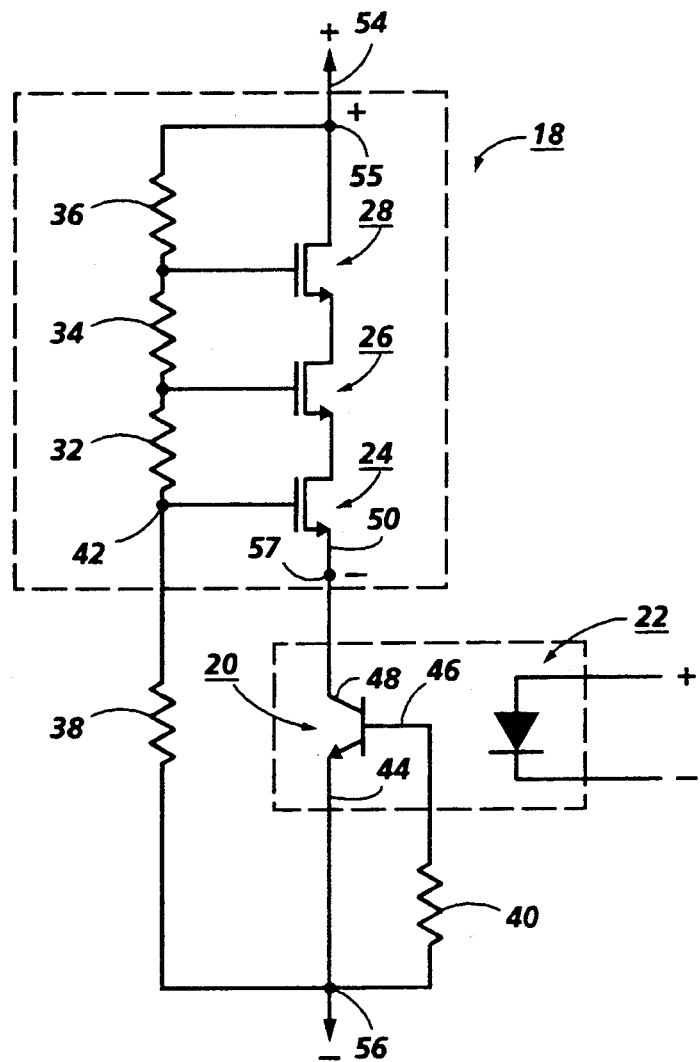
FIG. 2 is a schematic of a variable impedance circuit using an optoisolator transistor.

Turning now to FIG. 2, an optically controlled variable impedance circuit 18 comprised of an optoisolator transistor 20 controlled by an input LED 22 is shown. The optoisolator transistor 20 is used to turn on and off a series of high voltage MOSFETs 24, 26, 28. The series of high voltage MOSFETs 24, 26, 28 are connected in a cascaded fashion with bias resistors 32, 34, 36 The positive node for the cascaded high voltage MOSFETs 24, 26, 28 and bias resistors 32, 34, 36 subcircuit is node 55 and the negative node is node 57. A complete description of the operation and manufacture of the series of high voltage MOSFETs 24, 26, 28 and bias resistors 32, 34, 36 is contained in copending application for U.S. patent titled "Stacked High Voltage Transistor Unit" by Mohamed Mojaradi and Tuan Vo, attorney docket no. D/93289, assigned to Xerox Corporation (common assignee). The information contained in "Stacked High Voltage Transistor Unit" is herein incorporated by reference. While in this circuit the series of high voltage MOSFETs 24, 26, 28 are shown as NMOS devices, the circuit can also be fabricated using PMOS devices.

The optically controlled variable impedance circuit 18 also includes resistor 38 and resistor 40. Resistor 38 is connected from the input gate 42 of the high voltage MOSFET 24 in the series of high voltage MOSFETs 24, 26, 28 to the emitter 44 of the optoisolator transistor 20. This resistor is used to produce a bias voltage for collector 48 of the optoisolator transistor 20 which insures that optoisolator transistor 20 will be operating in its active region and not drift into its saturation region. Resistor 38 also provides the correct bias voltage to the input gate 42 of the high voltage MOSFET 24 to insure that high voltage MOSFET 24 stays turned on.

The resistor 40 is connected from the base 46 of the optoisolator transistor 20 to the emitter 44 of the optoisolator transistor 20. The resistor 40 is also used to bias the voltage at the base 46 of the optoisolator transistor 20 to insure operation in the active region. Additionally, resistor 40 filters noise from the circuit caused by migration of high voltage moving surface charges. Other commercial versions of the optoisolator transistor 20 have a noise-immunity floating base and do not require resistor 40.

The series of high voltage MOSFETs 24, 26, 28 are connected to the optoisolator transistor 20 by connecting the source 50 of the high voltage MOSFET 24 to the optoisolator transistor 20 at its collector 48. The other electrical end of the series of high voltage MOSFETs 24, 26, 28 becomes the positive node 54 of the optically controlled variable impedance circuit 18. The electrical connections of the resistor 38, the resistor 40, and the emitter 44 of the optoisolator transistor 20 are connected together as the negative node 56 of the optically controlled variable impedance circuit 18.

Figure 3:
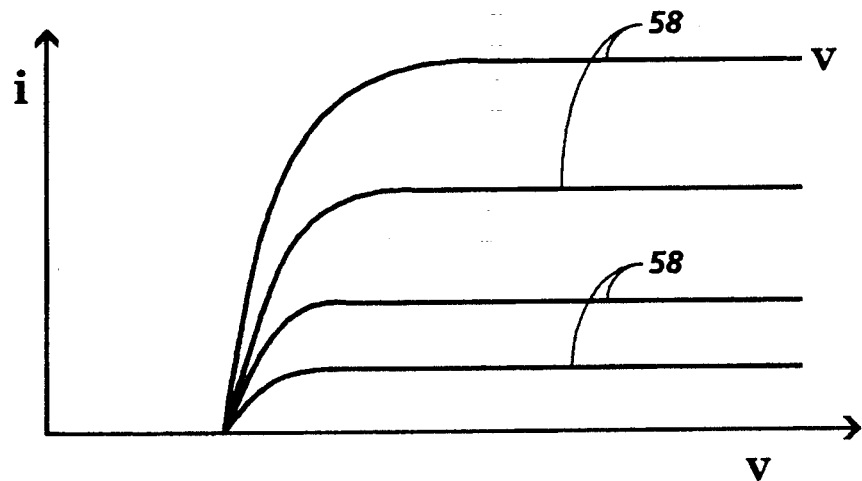
FIG. 3 is a graph of a series of current curves for the variable impedance circuit using an optoisolator transistor shown in FIG. 2.

FIG. 3 shows a typical series of curves 58 for the optically controlled variable resistance circuit 18. The horizontal axis represents voltage. The vertical axis represents. Each curve 58 is generated by a different voltage. The point where the curves 58 intersect with the horizontal axis is $V_{DD\ on\ min}$ for the optically controlled variable resistance circuit 18

Figure 4:
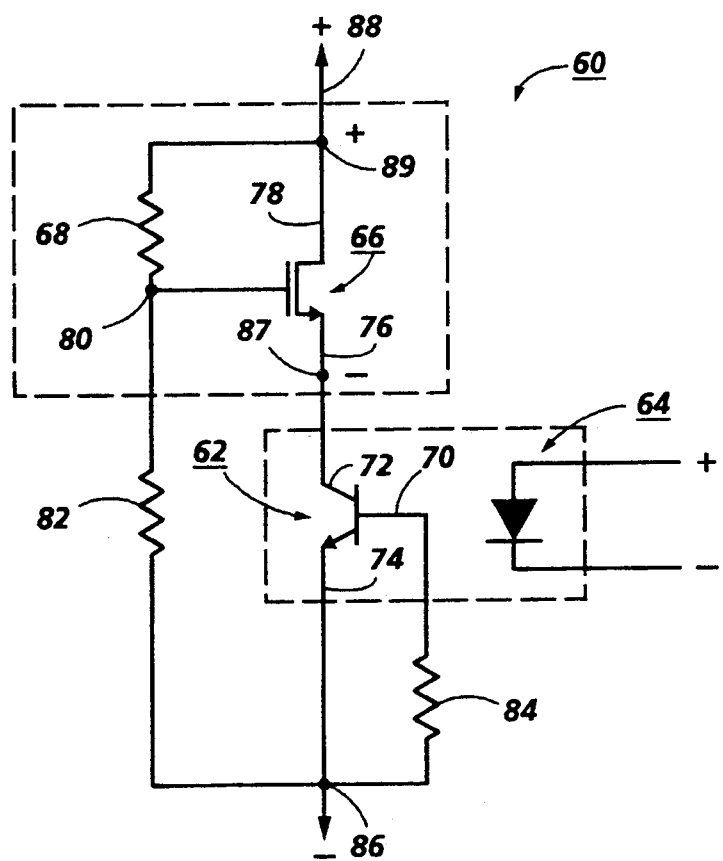
FIG. 4 is a simplified schematic of a variable impedance circuit using an optoisolator transistor shown in FIG. 2.

FIG. 4 shows a simplified optically controlled variable impedance circuit 60 for analysis where the series of high voltage MOSFETs 24, 26, 28 and the bias resistors 32, 34, 36 are represented by a single high voltage MOSFET 66, with a gate 80, a drain 78, and a source 76, a bias resistor 68 a positive node 89, and a negative node 87. The optically controlled variable impedance circuit 60 contains a optoisolator transistor 62 with a base 70, a collector 72, and a emitter 74 controlled by an input LED 64. A resistor 82 is connected between the gate 80 of the high voltage MOSFET 66 and the emitter 74 of the optoisolator transistor 62. A resistor 84 is connected between the emitter 74 of the optoisolator transistor 62 and the base 70 of the optoisolator transistor 62. The resistor 84 may be eliminated if an optoisolator transistor 62 is used with a noise immunity floating base. The node connecting the resistor 82, emitter 74 of the optoisolator transistor 62, and the resistor 84 is the negative node 86. The node connecting the resistor 68 and the drain 78 of the high voltage MOSFET 66 is the positive node 88.

Figure 1:
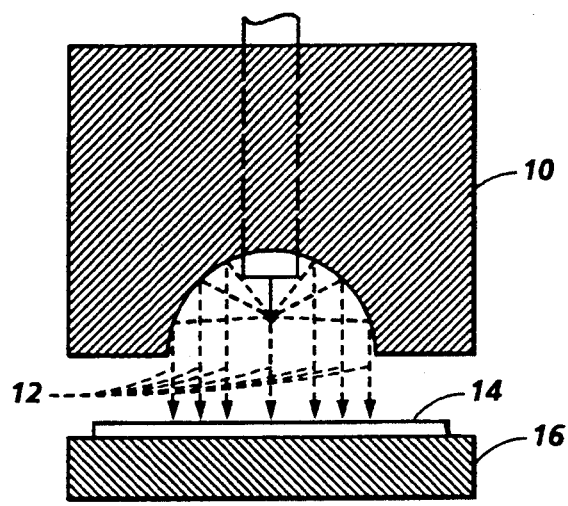
FIG. 1 is a side view of an LED/LDR.

In operation, either the positive node 88 or the negative node 86 is fixed at a given potential. For analysis, assume the positive node 88 is fixed at a given potential $V_d$. The current flowing through the high voltage MOSFET 66, and hence the impedance presented to the circuit by the high voltage MOSFET 66, is determined by the voltage drop between the gate 80 and the source 76 ($V_{gs}$) as shown in FIG. 3. Because, the voltage at the gate 80 and the source 76 of the high voltage MOSFET 66 are controlled by the optoisolator transistor 62, the impedance of the high voltage MOSFET 66 can be adjusted by driving the optoisolator transistor 62 with the input LED 64. The optical isolator transistor 62, and therefore the optically controlled variable impedance circuit 60, responds more quickly than the conventional LED/LDR shown in FIG. 1.

To insure correct operation, the value of resistor 82 must be carefully chosen so that optoisolator transistor 62 operates in the active region and high voltage MOSFET 66 is always turned on. The correct value for resistor 82 can be calculated by the following formula:

$$R_{82} = [(V_{t66} + V_{sat\ 62})(R_{68})] \div [V_{dd\ on\ min} - (V_{t66} + V_{sat\ 62})] \quad (1)$$

where $R_{82}$ = the ohmic value of resistor 82, $V_{t66}$ = the turn-on voltage of high voltage MOSFET 66, $V_{sat\ 62}$ = the saturation voltage of optoisolator transistor 62, $R_{68}$ = the ohmic value of resistor 68, and $V_{dd\ on\ min}$ = the minimum turn-on voltage of a transistor from FIG. 3.

The circuit in FIG. 2 operates in an identical manner. The series of high voltage MOSFETs 24, 26, 28 and bias resistors 32, 34, 36 are used to extend the voltage range of the optically controlled variable impedance circuit 18. The series of high voltage MOSFETs 24, 26, 28 and the bias resistors 32, 34, 36 perform the same function at much higher voltages than a single high voltage MOSFET.

The equation the correct value for resistor 38 is:

$$R_{38} = [(V_{t24,\ 26,\ 28} + V_{sat\ 20})(R_{eff\ 32,\ 34,\ 36})] \div [V_{dd\ on\ min} - (V_{t24,\ 26,\ 28} + V_{sat\ 20})] \quad (2)$$

where $R_{38}$ = the ohmic value of resistor 38, $V_{t24,\ 26,\ 28}$ = the sum of the turn-on voltages of high voltage MOSFETs 24, 26, 28, $V_{sat\ 20}$ = the saturation voltage of optoisolator transistor 20, $R_{eff\ 32,\ 34,\ 36}$ = the effective ohmic values of resistors 32, 34, 36, and $V_{dd\ on\ min}$ = the minimum turn-on voltage of a transistor from FIG. 3.

While optoisolator transistor 20 in FIG. 2 and the optoisolator transistor 62 in FIG. 4 is shown implemented with a bipolar transistor they could also be implemented using a MOSFET. The primary difference in operation between implementing the optoisolator transistor 20 with a MOSFET or a bipolar transistor is that a Bipolar transistor has an intrinsic gain not present in a MOSFET transistor.

Figure 5:
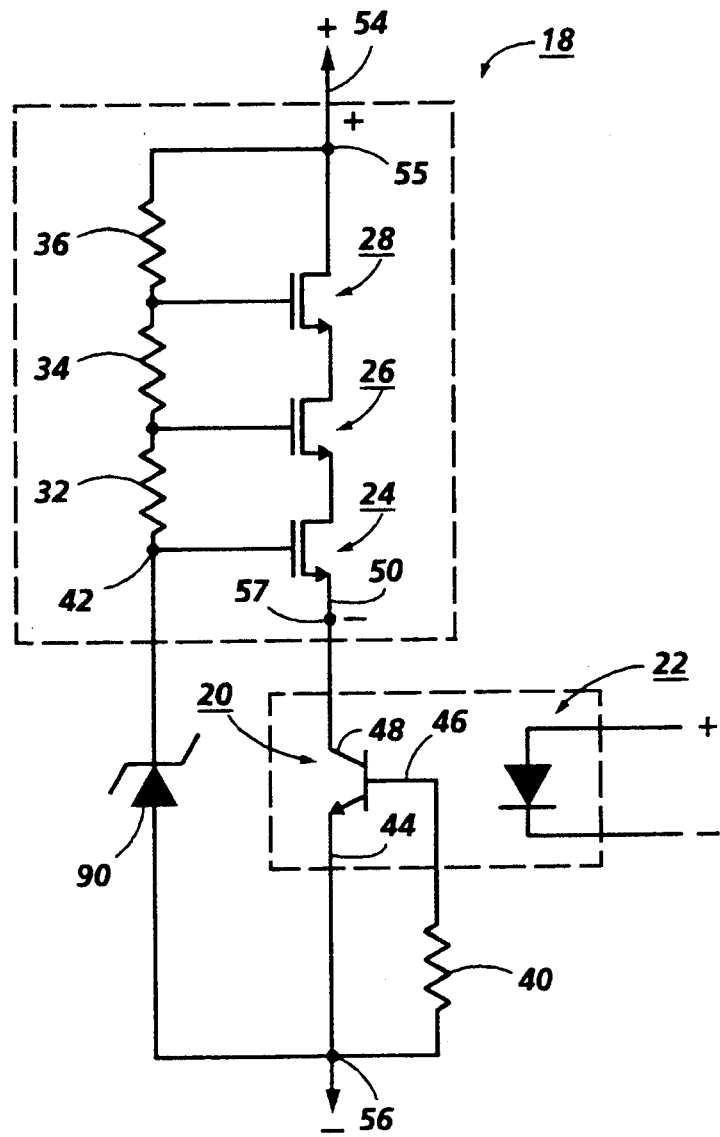
FIG. 5 is a schematic of an alternate variable impedance circuit using an optoisolator transistor shown in FIG. 2.
Figure 6:
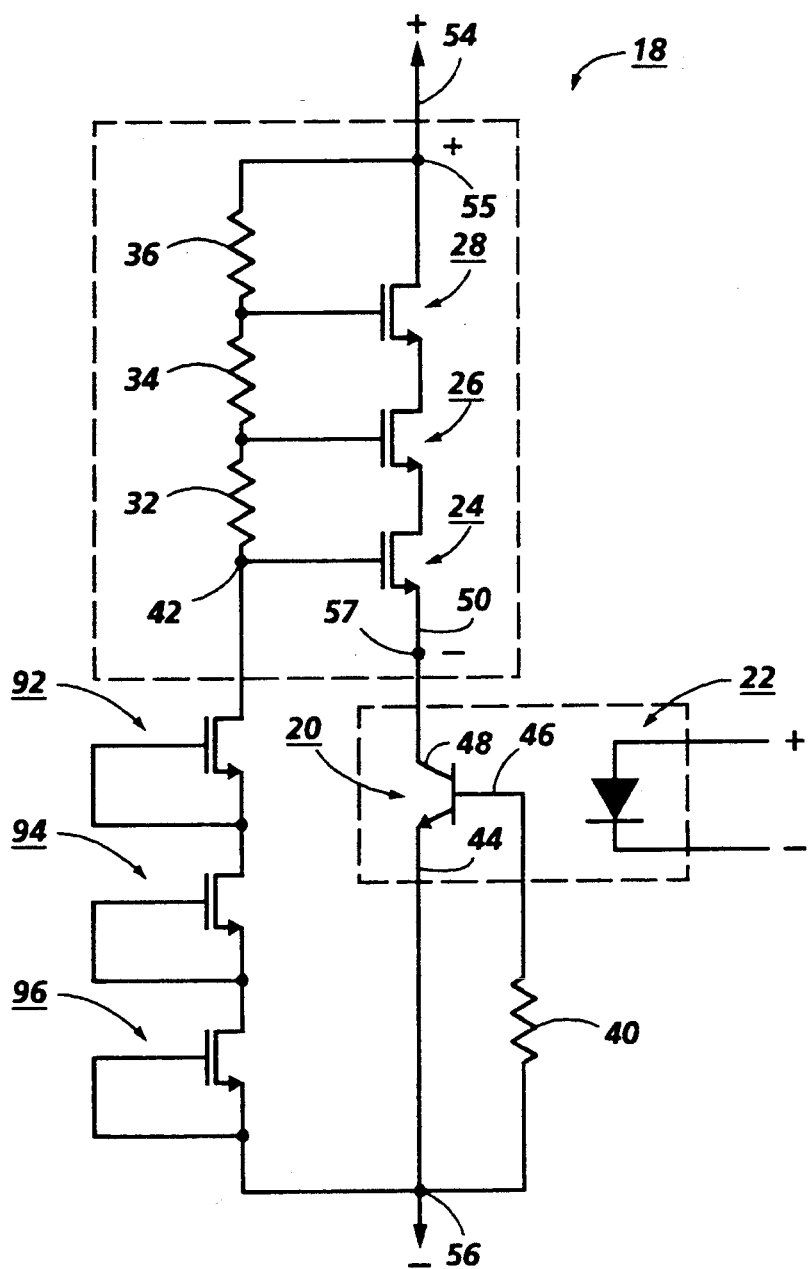
FIG. 6 is a schematic of an alternate variable impedance circuit using an optoisolator transistor shown in FIG. 2.

Two alternative circuits for the variable impedance circuit using a optoisolator transistor shown in FIG. 2 are shown in FIGS. 5 and 6. Identical elements are marked with the same reference numbers used in FIG. 2.

FIG. 5 uses a zener diode 90 instead of resistor 38 to bias high voltage MOSFET 24 and optoisolator transistor 20. When replacing the resistor 38 with zener diode 90 similar concerns dictate which values are appropriate to insure that the optically controlled variable resistance circuit 18 operates correctly. The correct value for zener diode 90 can be described by the following equation:

$$(V_{t24,\ 26,\ 28} + V_{sat\ 20}) < V_z \leq V_{br} \quad (3)$$

where $V_{t24,\ 26,\ 28}$ = the sum of the turn-on voltages of high voltage MOSFETs 24,26,28, $V_z$ = the value of the zener diode, and $V_{t20}$ = the breakdown voltage of optoisolator transistor 20.

However, zener diodes contribute noise to the circuit and may produce some oscillation on the output. A second alternative, shown in FIG. 6, eliminates the noise of the zener diode 90 by substituting MOSFETS 92, 94, 96 for the zener diode 90. The MOSFETS 92, 94, 96 are conventionally connected to operate as diodes and do not suffer from the noise problems of the zener diode 90 used in FIG. 5

We claim:

1. A variable impedance circuit comprising:
   a) a biased transistor means with a gate terminal, a drain terminal, and a source terminal,
   b) biasing means having an input and an output,
   c) an optoelectronic transistor means with a collector, an emitter which outputs emitter current, and a base,
   d) a positive end node at a given voltage,
   e) a negative end node at a given voltage that is less than the positive end node voltage,
   f) the drain terminal of said biased transistor means being electrically connected to said positive end node,
   g) the gate terminal of said biased transistor means electrically connected to the input of said biasing means,
   h) the source of said transistor means electrically connected to the collector of said optoelectronic transistor,
   i) the emitter of said optoelectric transistor electrically connected to the output of said biasing means and said negative end node,
   j) a light emitting means, and
   k) the emitter being responisive to light from said light emitting means for changing the amount of emitter current.

2. The variable impedance circuit of claim 1 wherein said biased transistor means comprises:
   a) a transistor with a gate a drain and a source,
   b) a resistor with an input and an output,
   c) said transistor gate electrcially connected to said resistor output and said gate terminal,
   d) said transistor drain electrically connected to said resistor input and said drain terminal, and
   e) said transisotr source electrically connected to said source terminal.

3. The variable impedance circuit of claim 2 wherein said transistor comprises an NMOS device.

4. The variable impedance circuit of claim 2 wherein said transistor comprises a PMOS device.

5. The variable impedance circuit of claim 2 wherein said transistor comprises a Bipolar device.

6. The variable impedance circuit of claim 1 wherein said biasing means comprises a resistor.

7. The variable impedance circuit of claim 1 wherein said biasing means comprises a zener diode.

8. The variable impedance circuit of claim 1 wherein said biasing means comprises at least one diode connected MOSFET.

9. The variable impedance circuit of claim 1 wherein said biased transistor means comprises:
   a) a high voltage electronically stacked transistor series circuit comprising:
      i) an electrical series of two four terminal high voltage transistors, one of the two transistors being a first transistor in the electrical series and the other transistor being a last transistor in the electrical series, each transistor comprising:
         aa) a source region, a drain region, a gate region, and a resistor region
         bb) said regions being arranged in a concentric configuration with said drain region being the innermost region, said resistor region surrounding said drain region, said gate region surrounding said resistor region, and said source region surrounding said gate region,
         cc) a source in said source region with a source terminal,
         dd) a drain in said drain region with a drain terminal,
         ee) a gate in said gate region being electrically connected with said drain and source to receive information from said source and transmit information to said drain, said gate having a gate terminal,
         ff) a resistor terminal, and
         gg) a resistor means in said resistor region with an input and an ouput, the input being electrically connected to said gate terminal and the output being electrically connected to said resistor terminal
      ii) a series positive node,
      iii) a series negative node,
      iv) said source terminal of said first transistor being electrically connected to said series negative node,
      v) said resistor terminal and drain terminal of said last transistor being electrically connected to said series positive node,
      vi) said drain terminal of said first transistor being electrically connected to said source terminal of said last transistor, and
      vii) said resistor terminal of said first transistor being electrically connected to said gate terminal of said last said transistor,
   b) said series positive node being connected to said second terminal of said transistor means, said series negative node being connected to said third terminal of said transistor means, and said gate terminal of said first transistor being connected to said first terminal of said transistor means.

10. The variable impedance circuit of claim 1 wherein said biased transistor means comprises:
    a) a high voltage electronically stacked transistor series circuit comprising:
       i) an electrical series of at least three four terminal high voltage transistors, one of said transistors being a first transistor in the electrical series and another of said transistors being a last transistor in the electrical series, each transistor comprising:
  aa) a source region, a drain region, a gate region, and a resistor region
  bb) said regions being arranged in a concentric configuration with said drain region being the innermost region, said resistor region surrounding said drain region, said gate region surrounding said resistor region, and said source region surrounding said gate region,
  cc) a source in said source region with a source terminal,
  dd) a drain in said drain region with a drain terminal,
  ee) a gate in said gate region being electrically connected with said drain and source to receive information from said source and transmit information to said drain, said gate having a gate terminal,
  ff) a resistor terminal, and
  gg) a resistor means in said resistor region with an input and an ouput, the input being electrically connected to said gate terminal and the output being electrically connected to said resistor terminal
 ii) a series positive node,
 iii) a series negative node,
 iv) said source terminal of said first transistor being connected to said series negative node,
 v) said resistor terminal and drain terminal of said last transistor being connected to said series positive node, and
 vi) each of said transistors other than said first and said last transistors having:
   aa) its drain terminal electrically connected to said source terminal of a succeeding transistor in said electrical series,
   bb) its resistor terminal electrically connected to said gate terminal of a succeeding transistor in said electrical series,
   cc) its source terminal electrically connected to said drain terminal of a preceeding transistor in said electrical series, and
   dd) its gate terminal electrically connected to said resistor terminal of a preceeding transistor in said electrical series,
 b) said series positive node being connected to said second terminal of said transistor means, said series negative node being connected to said third terminal of said transistor means, and said gate terminal of said first transistor being connected to said first terminal of said transistor means.

* * * * *

UNITED STATES PATENT AND TRADEMARK OFFICE
CERTIFICATE OF CORRECTION

PATENT NO. : 5,381,018
DATED : January 10, 1995
INVENTOR(S) : Mojaradi et al

It is certified that error appears in the above--identified patent and that said Letters Patent is hereby corrected as shown below:

In column 1, line 36, the word "tile" should read the-.

In column 2, line 68 and column 3, line 1, "attorney docket no. D/93289" should read -U.S. Patent No. 5,382,826-.

Signed and Sealed this

Second Day of July, 1996

*Attest:*

BRUCE LEHMAN

*Attesting Officer*     *Commissioner of Patents and Trademarks*